(12) United States Patent
Schumacher et al.

(10) Patent No.: US 7,410,670 B2
(45) Date of Patent: Aug. 12, 2008

(54) PROCESS AND APPARATUS FOR DEPOSITING SINGLE-COMPONENT OR MULTI-COMPONENT LAYERS AND LAYER SEQUENCES USING DISCONTINUOUS INJECTION OF LIQUID AND DISSOLVED STARTING SUBSTANCES VIA A MULTI-CHANNEL INJECTION UNIT

(75) Inventors: Marcus Schumacher, Kerpen (DE); Peter Baumann, Aachen (DE); Johannes Lindner, Roetgen (DE); Marc Deschler, Aachen (DE)

(73) Assignee: Aixtron AG (DE)

( * ) Notice: Subject to any disclaimer, the term of this patent is extended or adjusted under 35 U.S.C. 154(b) by 0 days.

(21) Appl. No.: 11/377,759

(22) Filed: Mar. 16, 2006

(65) Prior Publication Data
US 2006/0249081 A1 Nov. 9, 2006

Related U.S. Application Data

(63) Continuation of application No. PCT/EP2004/052063, filed on Sep. 7, 2004.

(30) Foreign Application Priority Data

Sep. 17, 2003 (DE) .............................. 103 42 890
May 3, 2004 (DE) ....................... 10 2004 021 578

(51) Int. Cl.
  *C23C 16/00* (2006.01)
(52) U.S. Cl. .................. 427/248.1; 427/255.7
(58) Field of Classification Search .............. 427/248.1, 427/255.7
See application file for complete search history.

(56) References Cited

U.S. PATENT DOCUMENTS 6,194,229 B1 * 2/2001 Basceri .......................... 438/3

(Continued)

FOREIGN PATENT DOCUMENTS

DE 10057491 * 5/2002

(Continued)

OTHER PUBLICATIONS

PCT International Search Report, Mar. 30, 2005, 3 pages.

*Primary Examiner*—Timothy Meeks
*Assistant Examiner*—Elizabeth A Burkhart
(74) *Attorney, Agent, or Firm*—St. Onge Steward Johnston & Reens LLC

(57) ABSTRACT

The invention relates to a method and device for depositing at least one layer on at least one substrate in a process chamber. Said layer comprises several components and is insulating, passivating or electrically conductive. The components are vaporized in a tempered vaporization chamber by means of non-continuous injection of a liquid starting material or a starting material dissolved in a liquid using a respective injector unit. Said vapor is guided to the process chamber by means of a carrier gas. It is important to individually adjust or vary the material flow parameters, such as injection frequency and the pulse/pause ratio and the phase relation of the pulse/pauses to the pulse/pauses of the other injector unit, determining the time response of the flow of material through each injector unit. The pressure in the process chamber is less than 100 mbars, the process chamber is tempered and several series of layers are deposited on the substrate during one process step.

19 Claims, 2 Drawing Sheets

U.S. PATENT DOCUMENTS

| | | | |
|---|---|---|---|
| 2001/0034123 A1* | 10/2001 | Jeon et al. | 438/643 |
| 2001/0041250 A1* | 11/2001 | Werkhoven et al. | 428/212 |
| 2002/0030246 A1 | 3/2002 | Eisenbeiser et al. | |
| 2003/0003244 A1 | 1/2003 | Rossman | |
| 2003/0139005 A1* | 7/2003 | Song et al. | 438/216 |

FOREIGN PATENT DOCUMENTS

| | | | |
|---|---|---|---|
| DE | 10114956 | 10/2002 | |
| DE | 10156932 | 5/2003 | |
| EP | 1038988 | 9/2000 | |
| EP | 1069599 | 1/2001 | |
| JP | 2002173777 | 6/2002 | |
| WO | WO 00/63957 | * 10/2000 | |

* cited by examiner

PROCESS AND APPARATUS FOR DEPOSITING SINGLE-COMPONENT OR MULTI-COMPONENT LAYERS AND LAYER SEQUENCES USING DISCONTINUOUS INJECTION OF LIQUID AND DISSOLVED STARTING SUBSTANCES VIA A MULTI-CHANNEL INJECTION UNIT

CROSS-REFERENCE TO RELATED APPLICATIONS

This application is a continuation of International Patent Application No. PCT/EP2004/052063 filed on Sep. 7, 2004, which designates the United States and claims priority of German Patent Application No. 10342890.9 filed on Sep. 17, 2003 and German Patent Application No. 102004021578.2 filed May 3, 2004.

FIELD OF THE INVENTION

The literature describes processes, such as molecular beam epitaxy (MBE), organic chemical vapor deposition (MOCVD) and atomic layer deposition (ALD), for the deposition of metal oxide layers, such as hafnium oxide, aluminum oxide or praseodymium oxide.

BACKGROUND OF THE INVENTION

MBE allows the deposition of high-purity metal oxide layers, such as for example for praseodymium oxide layers on flat substrates. On the other hand, the edge coverage on patterned substrates is entirely inadequate. Good edge coverage is required for the production of electronic components with a high aspect ratio. By contrast, MOCVD and ALD can ensure good edge coverage for deposition on patterned substrates. Conventional MOCVD processes, which are based on liquid or solid precursors, use heated precursor containers to convert liquid precursors into the gas phase by means of a carrier gas. Most precursors for oxidic materials (or corresponding dilute solutions) generally are very volatile and are chemically and thermally unstable and change or decompose under such conditions, which means that the deposition is not reproducible. Therefore, various liquid precursor feed systems which are based on sudden vaporization of in each case small quantities of precursor by direct contact with heated surfaces have been developed for MOCVD. This entails drawbacks, such as vaporization properties which alter over the course of time as a result of the accumulation of deposits on the heated surfaces and the formation of particles. These drawbacks can be avoided by periodic injection of liquid precursors or solutions into a heated volume with subsequent contact-free vaporization. With conventional MOCVD, the poor atomic precision causes problems for example in the deposition of nanolaminates.

SUMMARY OF THE INVENTION

ALD is based on alternating, self-limiting chemical reactions for the successive deposition of monolayers. Pumping and purging cycles are introduced between the supply of the individual reagents. This leads to low throughputs and makes it difficult to produce multi-component oxides, since the starting substances are not mixed in the gas phase, as in standard MOCVD processes. In particular, therefore, ALD processes fundamentally cannot be used to produce layers which allow a gradient-like change between mixtures of a plurality of metal oxides of different types of materials in situ during the growth process. This drawback gives rise to parasitic intermediate layers between the individual layers of the different materials during the purging cycles, for example as a result of undesired oxidation of, for example, materials which intrinsically have a higher affinity for oxygen (Si-based systems). ALD also exhibits nonlinear growth as a function of the layer thickness. Moreover, only a small number of ALD precursors are available, and there are often contamination problems in the deposited films, for example when using chlorine-based precursors. To ensure the further development of electronic devices, for example for CMOS, DRAM applications, there is an ongoing search inter alia for high-k materials as alternatives to SiO2 as dielectric. Candidates of very particular interest in this context are aluminum oxide, hafnium oxide or praseodymium oxide, since these materials have excellent properties in terms of the dielectric constant and the leakage currents. Improved materials properties can be achieved by laminating or mixing these metal oxides with one another to improve the thermal stability also by adding silicon. MBE-deposited pure $Pr_2O_3$ films give a dielectric constant of 31 and, at a layer thickness of 1.4 nm and 1 V, a leakage current density of $5\times10^{-9}$ $A/cm^2$ will be achieved. This is a leakage current density that is approximately $10^4$ times lower than for $HfC_2$ or $ZrO_2$ films of the same thickness. Moreover, the electrical properties are stable after conditioning at 1000° C. Pure materials, such as pure $HfO_2$, $Al_2O_3$ and $Pr_2O_3$, do not meet the requirements with regard to dielectric constant, leakage current and thermal stability simultaneously.

The invention relates to a process for depositing at least one layer on at least one substrate in a process chamber, in which the layer consists of a plurality of components and is insulating, passivating or electrically conductive, the components being vaporized into a temperature-controlled vaporization chamber by means of discontinuous injection of a liquid starting substance or of a starting substance dissolved in a liquid by means of in each case an injector unit, and this vapor being fed to the process chamber by means of the carrier gas. Moreover, the invention relates to an apparatus for depositing at least one layer on at least one substrate, having a process chamber, the layer consisting of a plurality of components and being insulating, passivating or electrically conductive, the apparatus having injector units in each case associated with one component for the discontinuous injection of a liquid starting substance or a starting substance dissolved in a liquid into a temperature-controlled vaporization chamber, and means for feeding the vapor produced as a result of the vaporization of the starting substance, together with a carrier gas, into the process chamber.

A process of this type and an apparatus of this type are known from DE 100 57 491. This apparatus is used to vaporize liquid starting substances or starting substances dissolved in a liquid. An aerosol is generated by the injector unit. The droplets of the aerosol are vaporized in the vaporization chamber, with the required heat being drawn from the gas located therein. The vaporization therefore takes place without surface contact. Suitable starting substances are the compounds described by DE 101 56 932 A1 and DE 101 14 956 A1.

The object is achieved by the invention given in the claims. Claim 1 and Claim 17 are substantially based on the fact that the mass flow parameters which determine the time profile of the mass flow through each injector unit, such as the injection admission pressure, the injection frequency and the pulse/pause ratio as well as the phase relationship of the pulse/pauses with respect to the pulse/pauses of the other injector unit(s) are set or varied individually. The process chamber is preferably a vacuum chamber. The pressure there can be less than 100 mbar. The process chamber can be heated. A plurality of layer sequences can be deposited on the substrate during a single process step. These may be conductive, passivating or nonconductive layers. Conductive and nonconductive layers may alternate with one another. It is preferred for layers with a high dielectric constant to be deposited between two conductive layers. The deposition of the layer sequence is effected substantially merely by varying the mass flow parameters. The injection admission pressure and/or the injection frequency or the pulse/pause ratio can be varied in such a way that layers of different quality are deposited directly on top of one another without there having to be a pause between the deposition of the successive layers. Furthermore, with the apparatus according to the invention and the process according to the invention, it is possible to deposit gradient structures. This is achieved by continuously varying the mass flow parameters during the deposition of at least one layer. As a result, a layer composition which continuously changes is formed in the vertical direction. This method can also be used to effect continuous transitions between two deposited layers. It is advantageous if the mass flows of the starting substances to the injector units are determined by means of mass flow measurement. The mass flows can be set by varying the injection frequency, the pulse/pause ratio and/or the injection admission pressure. Suitable starting substances are in particular the metals mentioned in DE 10114 956 and DE 100 57 491 A1, in particular Al, Si, Pr, Ge, Ti, Hf, Y, La, Nb, Ta, Mo, Bi, Nd, Zr, Gd, Ba, Sr. The process and the apparatus are suitable in particular for the deposition of nanolaminates, hyperstructures, nucleation layers, oxides, mixed oxides, semiconducting layers and/or gradient layers. In addition to liquids, it is also possible for solids dissolved in a liquid to be used as starting substances. The deposition of passivation layers is carried out in particular with simultaneous addition of silicon or germanium. The passivation layers may also contain nitrides. To produce oxides, oxygen is supplied. It is particularly preferred to form praseodymium oxide, strontium tantalate and aluminum oxide or lanthanum oxide. Conductive layers may be metals, metal nitrides or silicides. The surface to be coated preferably has vertical structures. DE 101 56 932 shows structures of this type. These are trenches into which the vaporized starting substances diffuse in order to form uniform deposits at the walls and on the base of the structures. In a preferred refinement of the invention, it is provided that diffusion-promoting metal and/or non-metal compounds (surfactants) are additionally injected. The substrate holder can be driven in rotation. Each injector unit has an individual mass flow meter associated with it. A plurality of injection units may be associated with one multi-channel injection unit. It is then advantageous for each multi-channel injection unit to have an individual vaporization chamber associated with it. Each of these vaporization chambers can be temperature-controlled. The pipelines between the vaporization chambers and the process chamber may also be temperature-controlled. A gas distributor in showerhead form may be located within the process chamber. This gas distributor in showerhead form is located above the substrate. The process gas flows out of the openings disposed on the underside of the gas distributor into the process chamber in order to react on the surface of the substrate, the layer being formed. The oxygen supply and the supply of the diffusion-promoting agents can take place directly into the gas distributor. The apparatus has an electronic control device. This electronic control device is used to set and regulate the individual mass flow parameters.

As a result of the configuration according to the invention, it is possible to deposit pure oxides or a mixture of these metal oxides. Doping is also possible. The invention provides an apparatus and a process which, on an industrial scale, ensures the inexpensive deposition of high-purity, multi-component metal oxides based for example on praseodymium oxide, hafnium oxide or aluminum oxide layers with a good reproducibility, high uniformity and good edge coverage even on highly patterned substrates.

The discontinuous injection of at least two liquid or dissolved metal starting substances into at least one heated volume with subsequent conversion to the gas phase is pertinent to the invention. This is utilized to produce mixed or doped metal oxides, for example based on praseodymium oxide, hafnium oxide, aluminum oxide or strontium tantalate layers. This novel process allows not only the contract-free vaporization of metal oxide source materials, such as for example praseodymium precursors (or corresponding dilute solutions) and therefore the reproducible and particle-free deposition of praseodymium oxide layers, but also the admixing of further metal oxides during the layer forming via additional liquid precursor injection units, which can be set independently of one another in terms of injection rate or pulse/pause ratio but also phase relationship with respect to one another. Consequently, this process allows the forming of nanolaminates by cyclical addition of the individual sources and simultaneously also allows the in situ forming of gradient layers by altering the individual quantities of starting substances added. In a technical implementation, this is regulated by altering the respective injection frequency, pulse/pause ratio but also injection admission pressure changes. To deposit metal oxide materials in patterned substrates with high aspect ratios (such as deep trenches or high stacks), it is possible for diffusion-promoting metal or non-metal compounds (surfactants), such as for example Bi, Sb, Te, Pb, Ag, I, to be added discontinuously to the process via liquid precursor injection using the additional injection units. When forming a complete CMOS transistor stack, it is possible, starting from a silicon surface termination, to use alternative gate dielectrics and also alternative gate electrodes. In this case, the advantages of the process are considered to lie in the fact that, for example, an entire transistor stack can be fabricated in one processing sequence by in situ alteration of the gas phase composition. Starting from the injection of the starting substance for the surface termination, such as for example nitriding or growth of germanium, it is possible, by adding the starting substance for the gate dielectric while at the same time reducing the mass flow for the terminating layer, to apply the first layer sequence to a substrate without forming a parasitic interface. The same procedure can be employed for the boundary layer between gate dielectric and gate electrode, by simply adapting the mass flow of the individual species during the deposition process. Particularly here, it would even be possible for conductive silicates used for gate electrodes to be formed from the metal compounds by in situ admixing of silicon. Advantages of this process are therefore a high throughput, the possibility of depositing multi-component oxides and electrically conductive materials, good stoichiometric control, a high flexibility as a result of a large number of possible precursors, atomically precise deposition, production of nanolaminates and hyperstructures, controlled deposition of nucleation layers and gradient layers.

The invention also relates to a process for depositing at least one layer on at least one substrate in a process chamber, the layer consisting of a plurality of components, each component having an associated starting substance which is injected as gas or liquid into the process chamber, at least one first starting substance being fed to the process chamber discontinuously, in particular in pulsed fashion, and at least one second starting substance being fed to the process chamber continuously. The first starting substance may be a metal compound of the type described above. The second starting substance, which is supplied continuously, may preferably be an oxygen compound. The process can then be used to deposit an oxide layer. A process of this type can be used in particular to deposit an $HfO_2$ layer, a TaO5 layer or a SiGe layer. The starting substances which are added in pulsed fashion to the process chamber or to a vaporization chamber disposed upstream of the process chamber in the direction of flow may be liquids. These liquids can vaporize in the manner described above within the vaporization chamber and can be passed into a gas distributor by means of a carrier gas. The continuously added component can also be introduced into this gas distributor. One significant difference between this process and the ALD process or the conventional CVD process is that one component is supplied in the form of pulses and the other component is supplied continuously. The component supplied continuously is present in excess in the process chamber or on the substrate. The component added in pulsed fashion is the growth-limiting factor. During the pulse pauses, the surface can orient itself. The orientation of the surface takes place in an environment in which the second component is present in excess. The pulse widths can be selected in such a way that approximately one monolayer or only a few monolayers are deposited during a pulse. The first component, which is added in pulsed fashion, may be a metallic or metalorganic precursor. The second component may preferably be an oxygen component. It is also preferred to use MMP starting substances, which are added in pulsed fashion.

BRIEF DESCRIPTION OF THE DRAWINGS

An exemplary embodiment of the invention is explained below with reference to accompanying drawings, in which.

DETAILED DESCRIPTION OF THE INVENTION

The apparatus is used to deposit single-component and multi-component materials using discontinuous injection of liquid or dissolved metal starting substances via a multi-channel injector unit 6, it being possible for each channel 5 to be set individually in terms of injection frequency, injector admission pressure, pulse/pause ratio and phase relationship with respect to one another for the purposes of mass flow control. This apparatus is to be used in particular for the deposition of single-component and multi-component oxides (hafnium oxide, aluminum oxide, strontium tantalate, praseodymium oxide, etc.), laminated and mixed oxidic materials and single-component or multi-component electrically conductive materials, such as metals, metal oxides and electrically conductive semiconductor compounds. In this case, the process described above allows production of complex layer structures composed of passivation layers, dielectrics and electrode materials on highly patterned substrates by in situ mass flow control of the individual sources with atomic layer thickness control without interrupting the processing frequency.

Figure 1:
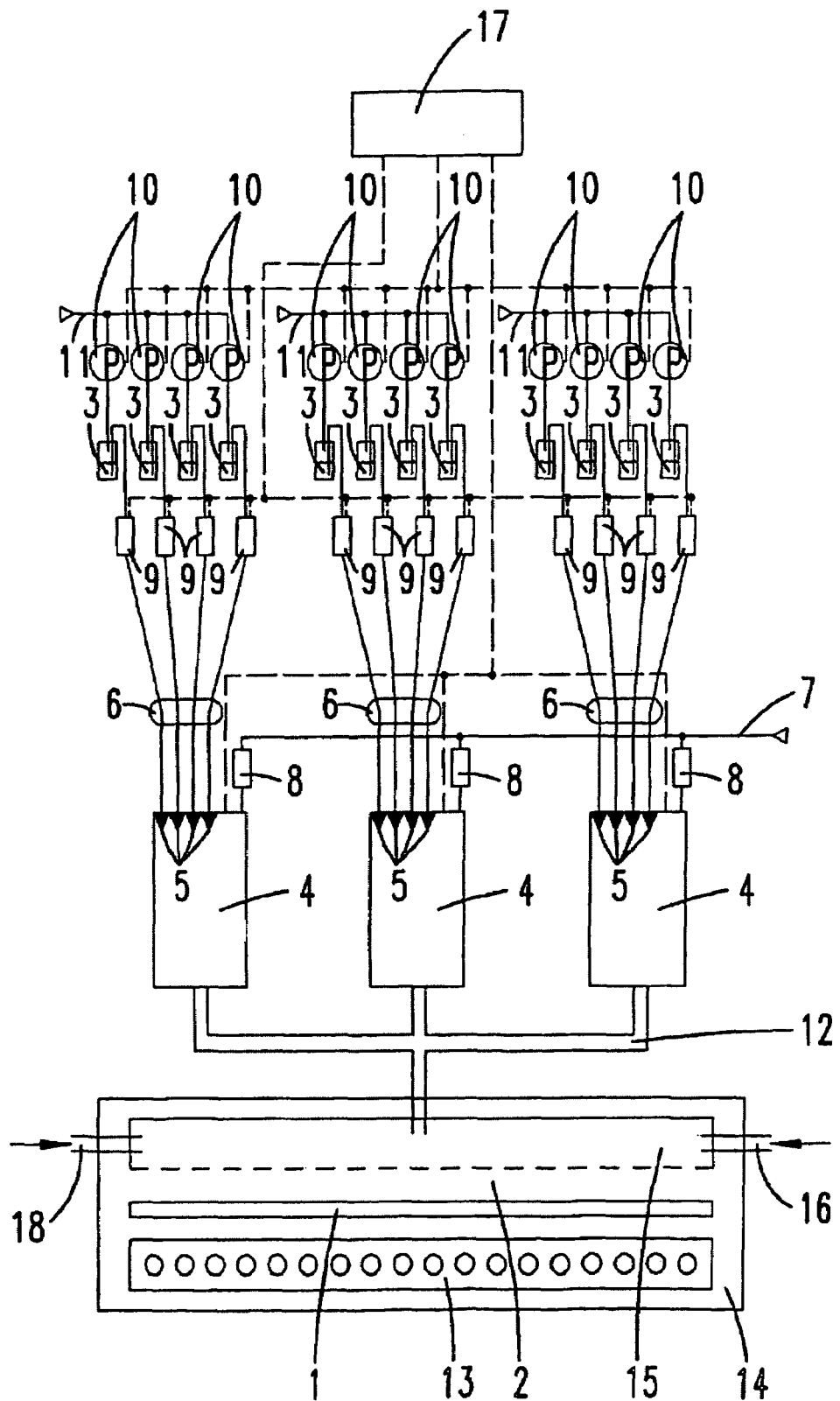
FIG. 1 diagrammatically depicts the structure of an apparatus according to the invention.

In detail, the apparatus has a reactor, which forms a reactor chamber 14. This reactor chamber 14 is connected, by means that are not shown, to a vacuum device (not shown). Within the reactor chamber is located a heater 13. The substrate 1 is disposed above the heater 13. The substrate 1 is illustrated on an enlarged scale in FIG. 1. In reality, it rests on a substrate holder, which can be driven in rotation. Above the substrate 1 is located the process chamber 2, which is delimited at the top by a gas distributor 15 of showerhead-like form.

A feedline 12 opens out into the gas distributor 15. The vaporized starting substances 3 together with a carrier gas 7 can be introduced into the gas distributor 15 through this feedline 12. Furthermore, it is also possible for diffusion-promoting metal or non-metal compounds to be passed into the gas distributor 15 through the feedline 16. Oxidants are introduced into the gas distributor via a feedline 18.

The abovementioned feedlines 12 may be temperature-controlled pipe connections. These connect vaporization chambers 4 to the gas distributor 15.

In the exemplary embodiment illustrated, a total of three vaporization chambers 4 are provided. However, there may also be more or fewer vaporization chambers 4. Each of these vaporization chambers 4 has a multi-channel injection unit, denoted by reference numeral 6. Each multi-channel injection unit 6 has a multiplicity of, in the exemplary embodiment four, injection units 5. However, there may also be more or fewer such injection units 5. The injection units 5 can each be used to inject a liquid starting substance 3 or a starting substance 3 dissolved in a liquid into the vaporization chamber 4 in aerosol form. Each injection unit 5 has an outlet valve, which opens and closes in pulsed fashion. The pulse widths can be varied between several seconds and a few milliseconds. It is also possible for the pulse widths to be varied within the same range. Each injector unit 5 is actuated individually by a control device 17. The mass flow parameters pulse width, pause width and pulse frequency can be individually controlled. The mass flow through each injector unit 5 is measured by means of a mass flow meter 9. The injection admission pressure, which can likewise be set individually for each injector unit 5, is set by means of a pressure regulator 10. The pressure which is set by the pressure regulator 10 is applied to a storage container in which the starting substance is located.

A feedline for a carrier gas 7 opens out into each of the vaporization chambers 4. The mass flow of the carrier gas 7 is set by means of a mass flow regulator 8.

Figure 2:
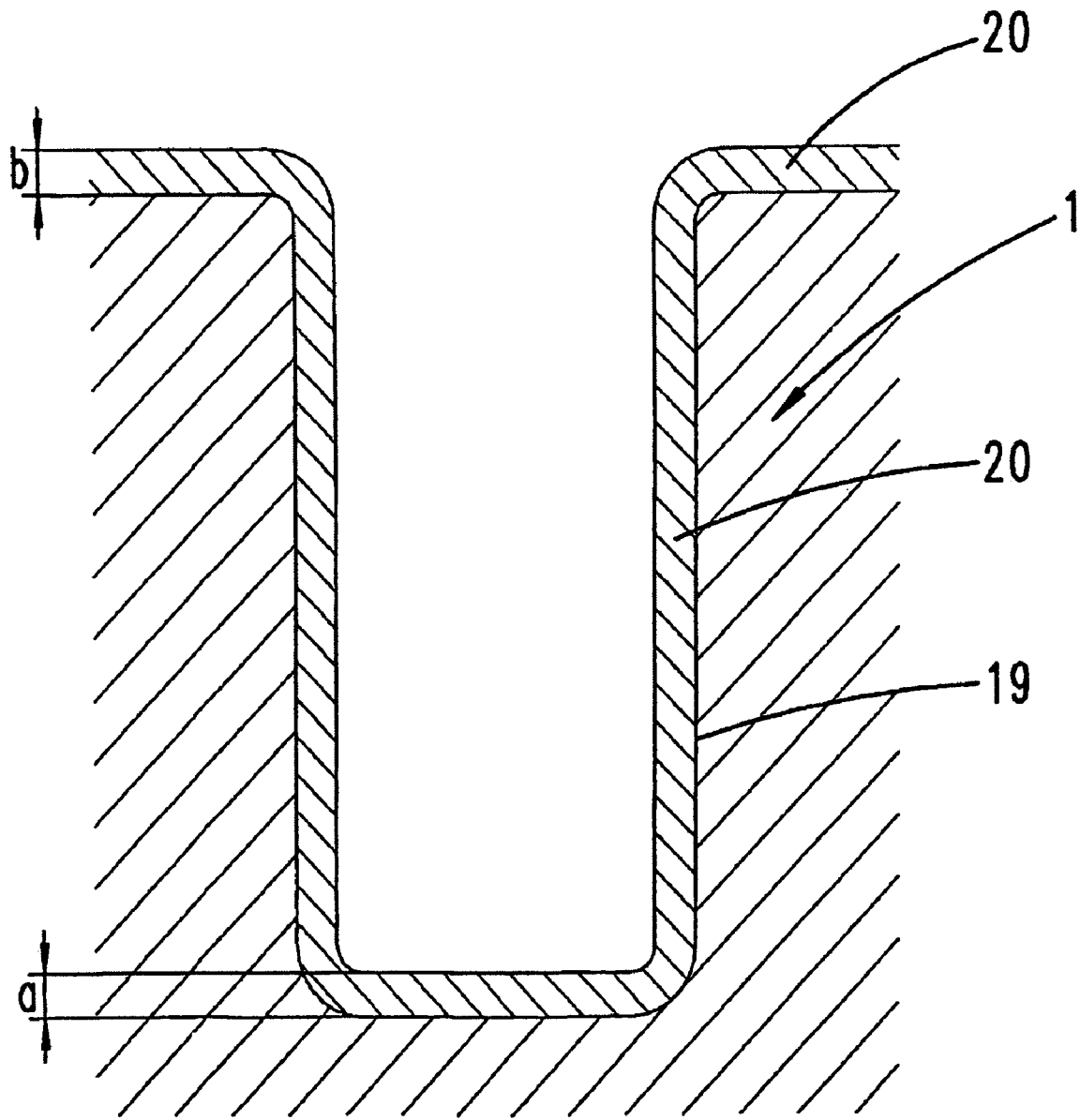
FIG. 2 shows a typical trench structure.

The apparatus is used to coat a highly patterned substrate as illustrated on an enlarged scale in FIG. 2. A substrate of this type has vertical structures, in particular trenches 19. The walls and the base of each trench 19 are to be coated with one or more layers. The layer thickness a at the base of the trench 19 should deviate as little as possible from the layer thickness b of the surface coverage of the substrate.

It is considered a particular advantage of the apparatus and of the process described above that both passivating, conductive and nonconductive layers can be deposited directly on top of one another on a substrate within one apparatus without the latter having to be opened.

All features disclosed are (inherently) pertinent to the invention. The disclosure content of the associated/appended priority documents (copy of the prior application) is hereby incorporated in its entirety in the disclosure of the application, partly with a view to incorporating features of these documents in claims of the present application.

What is claimed is:

1. A process for depositing at least one layer on at least one substrate in a process chamber, in which the layer consists of a plurality of components and is insulating, passivating or electrically conductive, the components being vaporized without contact into a temperature-controlled vaporization chamber by means of discontinuous injection of a liquid starting substance or of a starting substance dissolved in a liquid by means of a plurality of injector units, and this vapor in each case being fed to the process chamber by means of a carrier gas, the injection admission pressure in each case being set by means of a pressure regulator, and the mass flow in each case being determined by means of a mass flow meter, characterized in that the time profile of the mass flows through each injector unit are set using a control device, for which purpose the mass flow parameters injection admission pressure, injection frequency and pulse/pause ratio as well as the phase relationship of the pulse/pauses of each injection unit with respect to pulse/pauses of the other injector units are set or varied individually.

2. The process according to claim 1, characterized in that the pressure in the process chamber is less than 100 mbar.

3. The process according to claim 1, characterized in that the process chamber is temperature-controlled.

4. The process according to claim 1, characterized in that a plurality of layer sequences are deposited on the substrate during a process step.

5. The process according to claim 1, characterized in that only the mass flow parameters are varied during the deposition of a layer sequence.

6. The process according to claim 1, characterized by a continuous variation in the mass flow parameters during the deposition of at least one layer, so as to form a layer composition which alters continuously in the vertical direction or continuous transitions between layers deposited on top of one another.

7. The process according to claim 1, characterized in that the starting substances include metals, in particular Al, Si, Pr, Ge, Ti, Zr, Hf, Y, La, Nb, Ta, Mo, Bi, Nd, Ba, Sr and/or Gd.

8. The process according to claim 1, characterized by the deposition of nanolaminates, hyperstructures, nucleation layers, oxides, mixed oxides and/or gradient layers.

9. The process according to claim 1, characterized by a supply of oxygen or other oxidants, in particular one or more chemically reactive oxygen compounds, to form oxides.

10. The process according to claim 1, characterized in that metals, metal nitrides or silicides are deposited in order to deposit conductive layers.

11. The process according to claim 1, characterized in that passivation layers are formed by simultaneous addition of silicon or germanium and/or contain nitrides.

12. The process according to claim 1, characterized by the formation of praseodymium oxide, of strontium tantalate, of aluminum oxide and/or of lanthanum oxide.

13. The process according to claim 1, characterized in that the surfaces that are to be coated in particular have vertical structures, in particular trenches into which the vaporized starting substances diffuse in order to effect uniform deposition at the walls and on the base of the structures.

14. The process according to claim 1, characterized by the additional injection of diffusion-promoting metal and/or non-metal compounds (surfactants), for example Bi, Sb, Te, In, Ag, I into the process gas.

15. The process according to claim 1, characterized in that at least one first starting substance is fed to the process chamber discontinuously, in particular in pulsed fashion, and at least one second starting substance is fed to the process chamber continuously.

16. The process according to claim 15, characterized by the deposition of a plurality of layers on top of one another, with the second starting substance being fed to the process chamber continuously even during any growth pauses between the deposition of two layers.

17. The process according to claim 15, characterized in that the second starting substance is supplied continuously even during the growth pauses.

18. The process according to claim 15, characterized by selecting the pulse frequency and/or the pulse pauses in such a manner that the growth rate during one pulse is one monolayer or a few monolayers.

19. The process according to claim 15, characterized by selecting the pulse frequency and the pulse pauses in such a manner that the surface of the deposited layer can orient itself within the pulse pause.

* * * * *